United States Patent
Bourgoin

(10) Patent No.: US 7,217,324 B2
(45) Date of Patent: May 15, 2007

(54) METHOD AND DEVICE FOR PRODUCING AN ELECTRONIC GAAS DETECTOR FOR X-RAY DETECTION FOR IMAGING

(75) Inventor: Jacques Bourgoin, Thomery (FR)

(73) Assignee: Universite Pierre et Marie Curie, Paris (FR)

(*) Notice: Subject to any disclaimer, the term of this patent is extended or adjusted under 35 U.S.C. 154(b) by 477 days.

(21) Appl. No.: 10/466,761

(22) PCT Filed: Jan. 30, 2002

(86) PCT No.: PCT/FR02/00362

§ 371 (c)(1),
(2), (4) Date: Dec. 8, 2003

(87) PCT Pub. No.: WO02/061852

PCT Pub. Date: Aug. 8, 2002

(65) Prior Publication Data

US 2004/0069213 A1  Apr. 15, 2004

(30) Foreign Application Priority Data

Jan. 31, 2001 (FR) .................... 01 01337

(51) Int. Cl.
*C30B 25/12* (2006.01)

(52) U.S. Cl. .............. 117/92; 117/89; 117/93; 117/95

(58) Field of Classification Search ............. 117/89, 117/92, 93, 95
See application file for complete search history.

(56) References Cited

U.S. PATENT DOCUMENTS 5,725,659 A  3/1998  Sepehry-Ford et al.
5,733,815 A  3/1998  Ashkinazi et al.

OTHER PUBLICATIONS

A. Owens, M. Bazdaz, S. Kraft, A. Peacock, S. Nenonen, H. Andersson, "The Hard X-Ray Response of Epitaxial GaAs Dectors," Nuclear Instruments & Methods in Physics Research, vol. 442, No. 1-3, Mar. 2000.
R.L. Bates, S. Manolopoulos, K. Mathieson, S. Meikle, V. O'Shea, C. Raine, K.M. Smith, J. Watt, C. Whitehill, S. Pospisil, I. Wilhelm, Z. Dolezal, H. Juergensen, M. Heuken, "Development of Low-Pressure Vapour-Phase Epitaxial GaAs for Medical Imaging," NI&MPR, vol. 434, No. 1, Sep. 1999.

*Primary Examiner*—Felisa Hiteshew
(74) *Attorney, Agent, or Firm*—Arent Fox LLP

(57) ABSTRACT

The invention relates to a method for producing an X-ray detector for imaging. By increasing the epitaxial layers, a GaAs material (1) is placed on a substrate n<+> (or p<+>) (2). p<+> (or n<+>)< >ions are then implanted on the external face (11) of the material (1) in order to form a p<+>/i/n<+> structure after annealing. Ohmic contacts (12) are subsequently disposed on the two faces and individual detectors (pixels) (13) are produced over the entire surface using means of dry or chemical masking and pickling. The epitaxial material (1) has a thickness d' that is sufficient to absorb effectively the X photons and means can be used to reduce the residual doping of said material (1). The material obtained in this way is suitable for medical (mammography, dental, etc.) and industrial imaging.

10 Claims, 2 Drawing Sheets

METHOD AND DEVICE FOR PRODUCING AN ELECTRONIC GAAS DETECTOR FOR X-RAY DETECTION FOR IMAGING

CROSS-REFERENCE TO RELATED APPLICATION

This application is a National Stage entry of International Application No. PCT/FR02/00362 Jan. 30, 2002.

This invention concerns a method for producing an electronic GaAS detector for X-ray detection for medical imaging as well as imaging for certain industrial applications (such as inspection of luggage in airports).

There are two categories of X-ray detectors in addition to photographic plate. The first one implements a photosensitive layer (for instance phosphor) which transforms the X photons into visible photons; whereas said photons are then detected using techniques applicable thereto. The second one makes use of semiconductor materials which transform directly the X photons into electrons, thereby enabling direct acquisition of the image in digital format. The latter detectors exhibit numerous advantages with respect to photosensitive layers. They enable to acquire images at a higher rate and their performances (collection efficiency or sensitivity, noise, dynamics, acquisition speed) are better. Currently, the sole semiconductor material having adapted electronic properties and the necessary thickness (a few 100 µm to absorb the X photons efficiently) is CdTe. But owing to the small size of the crystals available, the implementation of this material in X imaging is not possible at industrial scale.

A new generation of wide surface area electronic detectors for medical imaging are known today. This generation uses a scintillator (caesium iodine), transforming the X photons into visible photons, which are then detected by a matrix of photoconductor pixels provided on a layer of amorphous Si (a-Si) (General Electric, Canon, Trixell). The global output is not optimum. These detectors enable only a reduction of the order of a factor 5 in the irradiation dose of the patient in comparison with the photographic plate. To come closer to the limits of X photon detection and for correct imaging, a semiconductor material is needed which meets the following requirements:

a large size material, with high atomic number Z,
a cheap material for which a well mastered microelectronic technology is available,
a material of good quality, i.e. containing few traps and defects distributed uniformly.

CdTe and InP do not meet one or several of these criteria and are therefore not suitable. There remains GaAs, not in massive form (i.e. obtained by Czochralski growth (Cz) or Vertical gradient freeze (VGF)) since it then contains too many traps distributed in a non-homogeneous fashion. There remains only GaAs obtained by epitaxial growth, which may be relatively pure and has very uniform electronic properties.

There exist moreover well-proven epitaxial growth techniques, such as VPE (Vapor Phase Epitaxy) or CVD (Chemical Vapor Deposition). Thanks to these techniques, the epitaxial layers are then obtained by transporting the gas, containing the constituents of the layer to be formed, to a substrate where they are broken down and react with the surface. The factor limiting the growth of the film being the transport of said gases to the substrate, the growth speed is slow (approx. 1 to 5 µm per hour) and very large volumes of gas are necessary to obtain a thick layer (a few hundred µm). Consequently, on top of the expensive aspect, i.e. large volumes of said necessary gases, price of the reactor, operating time, collection and destruction of residual gases, these techniques exhibit significant risks inherent to the nature of the gases employed, for the people as well as for the environment.

These techniques enable to obtain layers exhibiting good global homogeneity of the electric properties which, thus provided exhibit all the features necessary to produce good detectors (Owens et al. [J. Appl. Phys.; 86 (1999) 4341]) but the growth rate is small (at best 5 µm/h$^{-1}$) and does not enable therefore to obtain layers which are sufficiently thick to absorb the X photons efficiently under reasonable industrial production conditions.

The purpose of this invention is therefore to provide a method and a device simple in its design and its operating mode, which is non-polluting, quick and economic for the realisation of electronic detectors using epitaxial layers of GaAs, which may be used for the detection of X-rays, in particular for imaging.

To this end, the invention relates to a method for producing an electronic GaAs detector for X-ray detection for imaging wherein:

a method for growing an epitaxial layer on a substrate n$^+$ (or p$^+$) is used in order to form a semiconductor material which material contains a certain residual doping, the thickness of the substrate is reduced by mechanical-chemical polishing, a p$^+$/i/n$^+$ structure is formed:

ions p$^+$ (or n$^+$) are then implanted on the external face of the material, said structure is annealed at a temperature $\theta_1$ for a duration $t_1$, ohmic contacts are disposed on both faces individual detectors are produced by masking, passivation and chemical pickling.

According to the invention, said method for growing layers of material comprises the following steps:

a source material, which a wafer cut into an ingot of semi-insulating GaAs, non-intentionally doped, is heated to a temperature $T_1 > 600°$ C., a reactive gas interacts chemically with the source material of temperature $T_1$ in order to create volatile products, said substrate n$^+$ (or p$^+$) is heated to a temperature $T_2 < T_1$, parallelism and thermal insulation of the substrate n$^+$ (or p$^+$) and of the source material are provided, the thickness d' of the epitaxial layer is sufficient in order to absorb the X photons efficiently.

In different particular embodiments of individual detectors on the external surface of the layer, each having its own advantages and liable to numerous technically possible combinations:

the ohmic contacts are produced by evaporation of a gold-based alloy, followed by annealing, the residual doping is reduced by uniform irradiation with approx. 1 MeV electrons and at a dose adjusted as follows: the capacity of an individual detector is measured as a function of the dose and the irradiation is stopped when the capacity is equal to that of the thickness of the layer d', the thickness d' of the layer depends on the energy of the X photons to be absorbed, but it ranges between 100 µm and 1 mm, the reactive gas is $H_2O$ under partial pressure of several hundred ppm, the growth is performed under purified hydrogen atmosphere, of the order of the atmospheric pressure.

The invention also concerns a device for producing an electronic GaAS detector for X-ray detection for imaging comprising:

a chamber, k feet (with k≧3) forming a tripod and insulating the chamber thermally from the remainder of the device, a first plate mounted on the tripod and serving as a base for the remainder of the device, a first inert plate serving for thermal insulation of the base of the heating means, a first wafer comprising a duct in order to accommodate therein temperature measuring means, heating means comprising a first power-supplied heater and heating a substrate $n^+$ (or $p^+$) to a temperature $T_2>600°$ C., an inert ring of thickness d of the order of a few millimetres, separating and insulating the substrate $n^+$ (or $p^+$) and a source material thermally, a second power-supplied heater heating the source material to a temperature $T_1>T_2$, a second wafer comprising a duct in order to accommodate therein temperature measuring means, a second inert plate serving for thermal insulation of a second plate from the remainder of the device.

In different particular embodiments, each having its own advantages and liable to numerous technically possible combinations:

the parallelism of the source material and of the substrate $n^+$ (or $p^+$) is ensured in excess of within 0.1 mm by the inert ring of thickness d of the order of a few millimetres, the inert ring enables gaseous permeability between the space where the reactions take place and the internal atmosphere of the device, $H_2$ purified, containing $H_2O$ at a controlled pressure, the chamber is evacuated by a pump before introduction of purified $H_2$ and after deposition of the epitaxial layer in order to filter the products derived from the reaction.

The detector thus provided may be used on its own for the detection of X photons, whereof the energy ranges between 20 and 60 keV. This detector may also be used for higher energies of X photons, but the lowest absorption coefficient of GaAs for these energies reduces the sensitivity thereof. It may be implemented advantageously for medical imaging and certain industrial applications (for instance: inspection of luggage in airports).

The invention will be described more in detail with reference to the appended drawings wherein.

One of the conditions required for the application of electronic detectors to imaging is that the size of the semiconductor material whereon the detectors are placed should be large enough. Still, the production of large epitaxial layers is linked to the existence of large diameter monocrystalline bars wherein substrates of good crystallographic quality may be cut. Besides, these layers must be realised with materials whereof the atomic number Z is high (i.e. those for which the absorption of the X photons is significant: InP, CdTe, GaAs), i.e. those for which wide crystals exist. Among these materials, GaAs enables to obtain substrates which may be up to fifteen centimetres in diameter. CdTe crystals exist only in smaller dimension (a few centimetres in diameter) and InP crystals are crystals average size of, of the order of 5 cm in diameter. GaAs exhibits the advantage, on top of its intrinsic properties which are more or less common with InP and CdTe (band gap 1.4 eV, good absorption coefficient up to at least 60 keV, high mobility of charge carriers) that the microelectronic technologies for such material are already standardised in the industry. The material used for increasing epitaxial layers is therefore GaAs.

Figure 1:
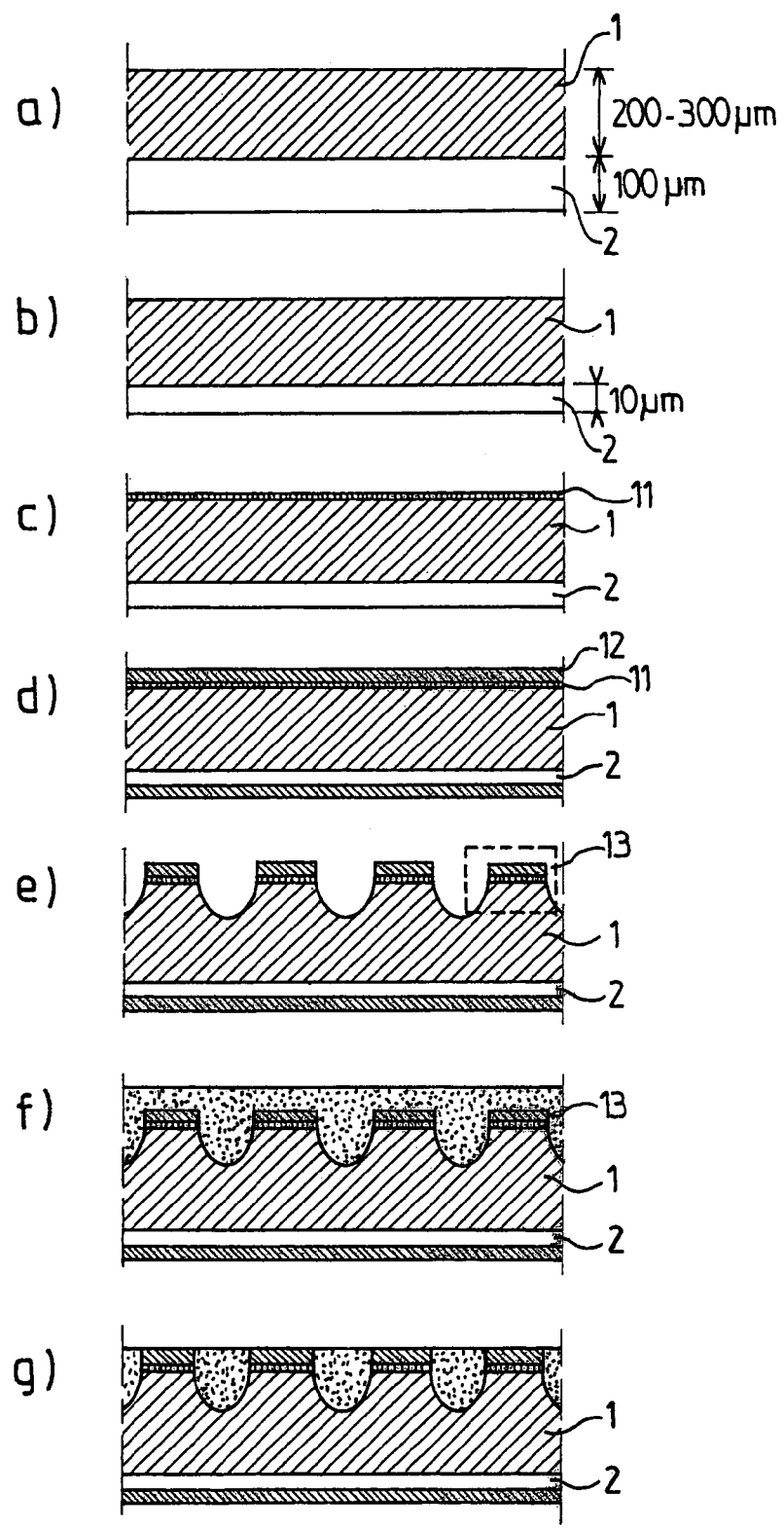
FIG. 1 is a schematic representation of the successive steps 1a), 1b), 1c), 1d), 1e), 1f) and 1g) leading to the realisation of a X-ray detector, according to the invention.
Figure 2:
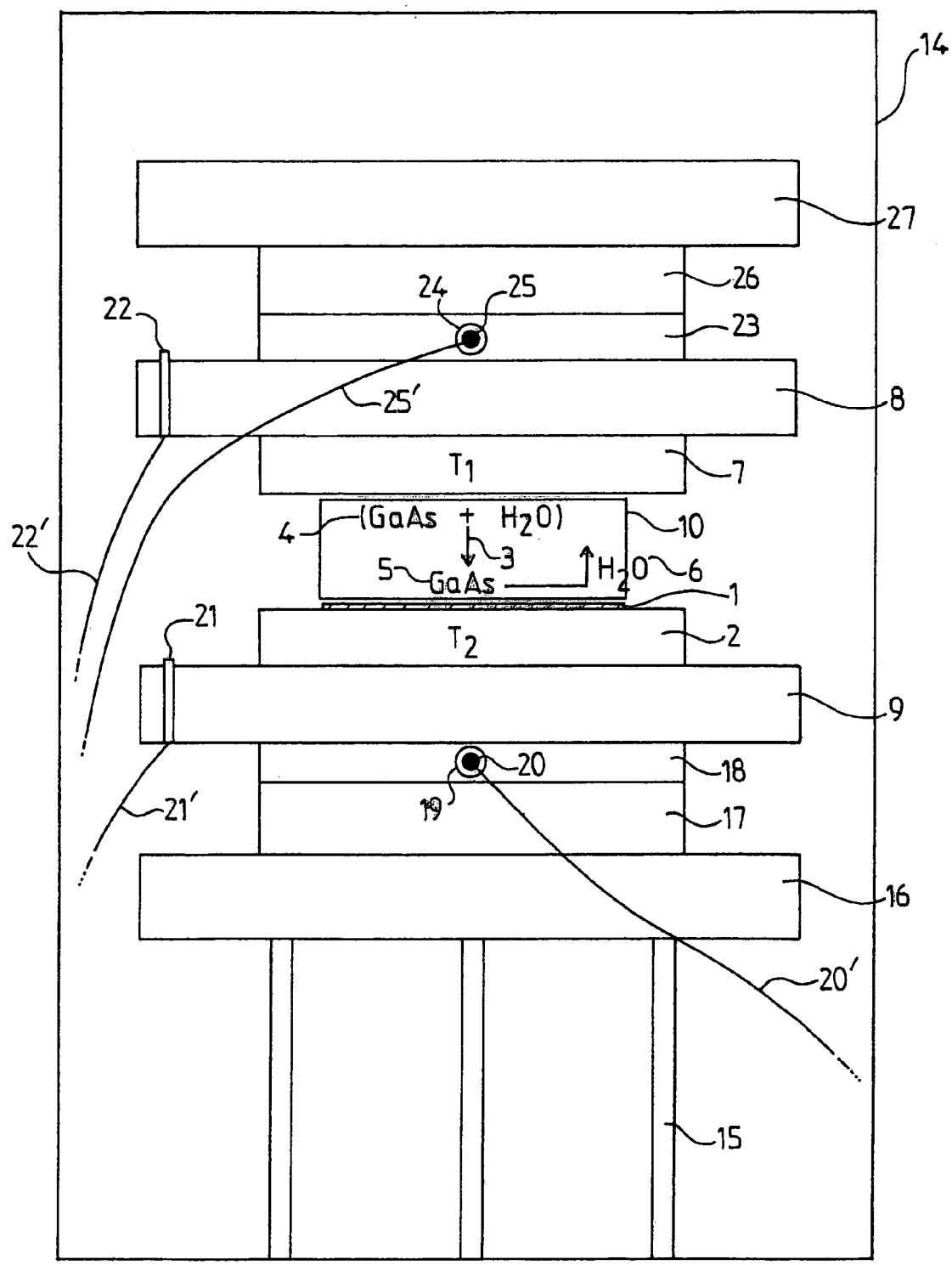
FIG. 2 is a schematic representation of the device for growing epitaxial layers, according to the invention.

According to the invention as represented on FIG. 1, the method leading to the production of GaAs-based X-ray detectors comprises the following successive steps. The first step 1a) consists in growing epitaxial layers 1 of thickness d' depending on the energy of the photons to be detected on a substrate $n^+$ (or $p^+$) 2. The material deposited 1 does not result from the use of a conventional technique for growing epitaxial layers (VPE or CVD). Indeed, with the latter techniques, the factor limiting the growth of the layer 1 is the transport of gases, containing the constituents of the layer to be formed on the substrate 2. The growth rate remains hence low (at best 5 μm.h$^{-1}$). Still, the detection of X photons calls for the growth of epitaxial layers 1 of thickness 100 μm, minimum. The conventional techniques do not allow therefore producing, within reasonable time, the growth of an epitaxial layer 1 whereof the thickness is sufficient to absorb the X photons efficiently. The growth of the epitaxial material 1 results therefore from a method aiming at suppressing the transport of the gases to the substrate 2 in order to provide quicker growth rate. According to the invention and FIG. 2a), the rate 3 with which the material is transported from the source 1 to the substrate $n^+$ (or $p^+$) 2 then depends only on the speeds of the chemical reactions between the source materials 4, the substrate 5 and the reactive gas 6. To do so, a source material 7 having the same chemical composition as the material 1 to grow (GaAs), hence unintentionally doped and hence so-called semi-insulating, is heated to a temperature $T_1>600°$ C. (preferably ranging between 750 and 850° C.) by a heater 8. Said heater 8 consists of a metal resistor covered with boron nitride, but may be of a different nature (graphite ribbon, etc.) as long as it limits the pollution to the maximum of the layer to grow which may be induced by impurities. The reactive gas 6, $H_2O$, under partial pressure of 500 to 600 ppm interacts chemically with the source material 7 heated to the temperature $T_1$ while creating volatile products. These volatile compounds are transported by the pressure gradient 3 up to a substrate $n^+$ (or $p^+$) 2 heated to a temperature $T_2<T_1$ (advantageously lower by at least 50° C.) by the heater 9 identical to the first. The volatile products are then recomposed at the surface of the substrate $n^+$ (or $p^+$) 2 in order to re-form GaAs 5 and gaseous $H_2O$ 6. The latter is again available in order to take part in the reaction process. It is a closed system: it is therefore not necessary to have a continuous supply of reactive gas, nor a continuous supply of hydrogen. A ring of quartz, boron nitride or graphite 1), of thickness d ranging between 1 and 2 mm for a substrate of approx. 5 cm in diameter φ separates the substrate $n^+$ (or $p^+$) 2 from the source material 7 and ensures their thermal insulation. When the size of the substrate is greater, d should be increased (d is of the order of 3–4 mm for φ=10 cm).

Because of the temperature difference which is relatively small, between the source material 7 and the substrate 2, imposed by the short distance between said elements, the growth of the epitaxial layer 1 takes place under conditions close to the reaction equilibrium between the crystal and the reactive gas. Since the system is enclosed by the ring 10, the respective pressure ratio of the volatile products derived from the chemical reactions is such that the stoichiometric conditions are maintained. Thus, during the decomposition of GaAs 4 by $H_2O$ 6 given by the following equation:

$$GaAs(s)+H_2O(g) \rightarrow Ga_2O(g)+As_2(g)+H_2(g)$$

There exists a direct relationship between the pressure of $Ga_2O$ and $As_2$. It is therefore not necessary to introduce higher pressure of $As_2$ (g) with respect to that of $Ga_2O$ (g) as in techniques for growing epitaxial layers.

The growth rate of the epitaxial layers 1 depends, here, only on the respective temperatures $T_1$ and $T_2$, of the source material 7 and of the substrate $n^+$ (or $p^+$) 2, on the partial pressure p of the reactive gas 6.

The source material is doped unintentionally: it contains dopants of type p and n in concentration $10^5$–$10^{16}$ cm$^{-3}$ which are respectively mainly C and Si according to literature. The material thus provided also contains therefore these impurities, but in different proportions since the transport of these impurities depends on the nature thereof.

After growing the epitaxial layer 1, the thickness of the substrate 2 is reduced by mechanical-chemical polishing (step 2, FIG. 1b)) to bring its thickness back to approx. 10 μm. In a third step (FIG. 1c)), ions $Hg^+$ or $Be^+$ are implanted, respectively $Si^+$, with energies ranging between 10 and 200 keV (advantageously around 100 keV) and typical doses (of the order of $10^{14}$ atoms/cm$^2$) in order to form a doping-controlled layer 11 (higher than $10^{18}$ cm$^{-3}$) of type $p^+$, respectively $n^+$. This implantation is followed by quick thermal annealing at a given temperature (approx. 850° C.) and for a preset short duration (10 s). A junction $p^+/i/n^+$ has thus been produced. Then ohmic contacts 12 (step 4, FIG. 1d) are placed on both faces by evaporation of a gold-based alloy, followed by annealing at a temperature of the order of 400° C. and for a preset duration (300 s). This alloy is for instance AuGe or NiAu for the contacts $n^+$ and TiPtAu or AuZn for the contacts $p^+$. This step is followed by masking, photolithography, chemical pickling (step 5, FIG. 1e)) in order to form pixels.

These pixels 13 produced by lithography have surface areas generally of 50 to 150 μm$^2$ (for medical applications) made on one face or lines of the same dimension on each of the faces in quadrature (FIG. 1e)). These steps are completed by passivation of the pickled surfaces (by deposition of silicon nitride, for instance (step 6, FIG. 1f)) followed by an opening to the pixels by a new pickling after photolithography (step 7, FIG. 1g)) to take the contacts.

In a preferred embodiment, the residual doping of the epitaxial material 1 is reduced in order to increase the width W of the space charge so that it occupies the whole thickness of the layer. Indeed, the residual doping may also be such the maximum application voltage $V_m$ i.e. the breakdown voltage) is not sufficient to produce through depletion of the structure. For instance, a layer possessing initially $1 \times 10^{14}$ cm$^{-3}$ residual dopants may undergo depletion only over a zone as large as $W=23$ μm for a voltage of 40 V. Consequently, if the layer has a thickness of 100 μm, only a quarter thereof will be active. The solution, according to the invention, then consists in injecting defects into the layer in uniform concentration in order to trap the residual carriers. One of the ways of injecting these defects consists in uniform irradiation of the whole surface of the material, by means of an electron source of approx. 1 MeV In our example above, the injection of a $10^{14}$ cm$^{-3}$ defect concentration by this irradiation enables to compensate totally for the residual dopants and therefore to produce depletion over the whole thickness of the layer. For minimum injection of defects in order to exert a negligible impact over the performances of the detector, the capacity of one of the pixels of the detector will be measured in relation to the irradiation dose in order stop said dose as soon as the value of the capacity is equal to that of the thickness of the layer d'.

This irradiation can be performed once the detector is completed or even mounted and connected to its electronic circuitry.

The invention also relates to a device for producing an electronic GaAs detector for X-ray detection for imaging. According to the invention and FIG. 2, this device comprises a chamber 14 made of stainless steel, within which are arranged means for growing the layers. This chamber comprises a set of connections enabling to inject purified hydrogen after vacuum pumping and evacuation, at the end of the deposition, of the chemical reagents derived from the breakdown of GaAs 4 by $H_2O$ 6 in order to treat them. The evacuation and the vacuum are made using a primary pump. This chamber 14 also comprises a set of connections enabling to provide electric contacts between the power supply sources, the temperature reading gauges and the inside of the device.

The means for increasing the layers are carried by a tripod 15 consisting of k feet made of stainless steel (with $k \geq 3$). This tripod enables to insulate thermally the chamber 14 from the remainder of the device. On this tripod 15 is mounted a first stainless steel plate 16 serving as a base for the growth means. These growth means comprise a first quartz plate 17 which enables to insulate thermally the stainless steel base 16 from the heating means. These heating means comprise a first heater 8 power supplied by connections 21. Said heater 8 consists of a metal resistor covered with boron nitride. A first stainless steel wafer 18 of thickness of the order of one millimetre enables to measure the temperature of the heater 8. This temperature measurement controls the temperature adjustment of the device. The wafer 18 comprises a duct 19 in order to inject therein temperature measuring means, a thermocouple for instance, 20. The first heater 8 enables to heat to a temperature $T_2 > 600°$ C., a substrate $n^+$ (or $p^+$) 2. On this substrate is placed a ring 10, inert under the experimental conditions described (i.e. $T_i > 600°$ C. where i=1,2) and of thickness d of the order of a few millimetres. It separates and insulates thermally the substrate $n^+$ (or $p^+$) 2 from a source material 7. In order to avoid non uniform deposition conditions, the parallelism of the source material 7 and of the substrate $n^+$ (or $p^+$) 2 is ensured by the inert ring 10 better than within 0.1 mm. The inert ring 10, a ring made of quartz, boron nitride or graphite, also ensures gaseous permeability between the space where reactions take place and the internal atmosphere of the device, purified $H_2$ under a pressure of the order of the atmosphere and $H_2O$ 6 under a partial pressure p of the order of 300 to 900 ppm according to the requested growth speed. As the inert ring 10 does not provide perfect tightness, $H_2O$ 6 and purified $H_2$ may go through.

A second heater 9 supplied with power 22 enables to heat the source material 7 to a temperature $T_1 > T_2$. The temperature difference between $T_1$ and $T_2$ is preferably greater than 50° C. A second stainless steel wafer 23 of thickness of the order of one millimetre comprising a duct 24 in order to accommodate therein temperature measuring means 25, a thermocouple, for instance, enables to verify the temperature of the second heater 9. The power supply and measuring cables 20', 21', 22' and 25' refer to the elements of the device carrying the corresponding number. A second quartz plate 26 is placed on the stainless steel wafer 23 and is used for thermal insulation of a second stainless steel plate 27 and the chamber 14 from the heating means. This second stainless steel plate 27, because of its own weight, also fosters uniform deposition conditions while ensuring a narrow contact between the inert ring 10, the substrate n+ (or p+) 2 and the source material 7 during heating.

This method may be employed advantageously for the production of detectors using GaAs since this material is particularly efficient over the energy range: 20–60 keV. This energy range is suited in particular for medical imaging (mammography, dental care, etc.) and certain industrial applications (example: inspection of luggage in airports). As regards medical imaging, the detector described should lead to reducing the dose of X irradiation by a factor 10 with respect to conventional techniques. Better resolution and higher dynamics may also be provided (Owens et al. [J. Appl. Phys.; 86 (1999) 4341]) thereby enabling to improve the image contrast and to increase the number of tints. The acquisition speed of the image should also be very quick with respect to current advanced devices.

The invention claimed is:

1. A method for producing an electronic GaAs detector for X-ray detection for imaging, wherein an epitaxial layer is grown on a substrate n+ (or p+) to form a semiconductor material, which includes a predetermined residual doping, wherein a thickness of the substrate is reduced by mechanical-chemical polishing, wherein a p+/i/n+ structure is formed by implanting ions p+ (or n+) on an external face of the semiconductor material, wherein said p+/i/n+ structure is annealed at a temperature $0_1$ for a duration $t_i$, and wherein ohmic contacts are disposed on both faces of the p+/i/n+ structure, wherein individual detectors are produced by masking, passivation and chemical pickling, said method comprises the following steps:
  providing parallelism and thermal insulation between the substrate n+ (or p+) and a source material, wherein said source material is a wafer cut into an ingot of semi-insulating GaAs non-intentionally doped, said source material and said semiconductor material being of the same material;
  heating said source material to a temperature $T_1$>600° C.;
  heating said substrate n+ (or p+) to a temperature $T_2$<$T_1$;
  chemically interacting a reactive gas with the source material of temperature $T_1$ to create volatile products; and
  transporting said volatile products to said substrate n+ (or p+) by a pressure gradient between said heated source material and said heated substrate n+ (or p+);
  chemically interacting said volatile products at the surface of said substrate n+ (or p+) at temperature $T_2$ to recompose said reactive gas and the semiconductor material, wherein a resulting thickness of the epitaxial layer is attained that is sufficient to efficiently absorb X photons.

2. The method according to claim 1, wherein the ohmic contacts are produced by first evaporating a gold-based alloy.

3. The method according to claim 1 or 2, wherein said the residual doping is reduced by uniform irradiation with 1 MeV electrons and at an adjusted dose, and wherein the adjustment of said dose is performed by measuring a capacity of an individual detector according to the dose and stopping the irradiation when the capacity is equal to that of the thickness of the epitaxial layer.

4. The method according to claim 1 or 2, wherein the thickness of the epitaxial layer depends on an energy of the X photons to be absorbed, but ranges between 100 μm and 1 mm.

5. The method according to claim 1 or 2, wherein the reactive gas is $H_2O$ under a partial pressure of several hundred ppm.

6. The method according to claim 1 or 2, wherein growth of the epitaxial layer is performed under purified hydrogen atmosphere at atmospheric pressure.

7. A device for producing an electronic GaAS detector for X-ray detection for imaging comprising:
  a chamber;
  k feet (with k≧3) forming a tripod and thermally insulating the chamber from a remainder of the device;
  a first plate mounted on the tripod and serving as a base for the remainder of the device;
  a first inert plate;
  a first wafer comprising a first duct which accommodates a first temperature measuring means therein;
  heating means which includes a first power supplied heater and heats a substrate n+ (or p+) to a temperature $T_2$>600° C., said heating means being thermally insulated from said first plate by said first inert plate;
  an inert ring which separates and thermally insulates the substrate n+ (or p+) and a source material;
  a second power supplied heater which heats the source material to a temperature $T_1$>$T_2$;
  a second wafer comprising a second duct which accommodates a second temperature measuring means therein; and
  a second inert plate which thermally insulates a second plate from the remainder of the device.

8. The device according to claim 7, wherein parallelism between the source material and the substrate n+ (or p+) is maintained to be in excess of within 0.1 mm by the inert ring.

9. The device according to claim 7 or 8, wherein the inert ring enables gaseous permeability between a space where reactions take place and an internal atmosphere of the device, said atmosphere being composed of purified $H_2$ containing $H_2O$ at a controlled pressure.

10. The device according to claim 7 or 8, wherein the chamber is evacuated by a pump before the purified $H_2$ is introduced and after deposition of the epitaxial layer in order to filter products derived from such a reaction.

* * * * *